United States Patent

[11] 3,611,065

[72] Inventors Karl-Heinz Zschauer;
Gunter Winstel, both of Munich, Germany
[21] Appl. No. 862,264
[22] Filed Sept. 30, 1969
[45] Patented Oct. 5, 1971
[73] Assignee Siemens Aktiengesellschaft
Berlin, Germany
[32] Priority Sept. 30, 1968
[33] Germany
[31] P 17 89 063.0

[54] CARRIER FOR SEMICONDUCTOR COMPONENTS

3 Claims, 4 Drawing Figs.

[52] U.S. Cl. .................................................... 317/234 R, 317/235 R, 317/234 A, 317/234 L, 317/234 M, 317/234 N, 317/235 N, 29/589
[51] Int. Cl. .................................................... H01l 5/00
[50] Field of Search .......................................... 317/234, 235, 235 (1), 235 (4), 235 (5), 235 (5.3), 235 (5.4), 235 (27); 174/DIG. 3, DIG. 5; 29/580, 589, 591; 339/17 C, 17 CF, 17 N

[56] References Cited

UNITED STATES PATENTS

| | | | |
|---|---|---|---|
| 3,414,968 | 12/1968 | Genser et al. | 29/577 |
| 3,469,017 | 9/1969 | Starger | 317/234 X |
| 3,471,923 | 10/1969 | Larmorte et al. | 29/572 |
| 3,478,161 | 11/1969 | Carley | 317/234 X |
| 3,479,570 | 11/1969 | Gilbert | 317/234 |
| 3,486,082 | 12/1969 | Sakamoto | 317/234 |
| 3,489,956 | 1/1970 | Yanai et al. | 317/234 |
| 3,506,886 | 4/1970 | Hardy et al. | 317/234 |
| 3,509,434 | 4/1970 | Yanai et al. | 317/235 |

*Primary Examiner*—John W. Huckert
*Assistant Examiner*—B. Estrin
*Attorneys*—Curt M. Avery, Arthur E. Wilfond, Herbert L. Lerner and Daniel J. Tick

ABSTRACT: A carrier for semiconductor components which improves the electrical properties and the lifetime of the semiconductor components. The carrier is characterized by a carrier portion comprising electricity and heat conducting material and by a thin adhesive electrical insulation layer, at least on that surface of the carrier member that faces the semiconductor component.

CARRIER FOR SEMICONDUCTOR COMPONENTS

The invention relates to a carrier for semiconductor components which improves the electrical properties and the lifetime of the components.

In known semiconductor components, the active part of the structural component, e.g. the *p-n* junction of semiconductor diodes, is situated partly on the surface of the semiconductor crystal and is thus hardly protected against contaminations and disturbing influences from the ambient atmosphere. As a result, adequate stability of the electrical parameters over a period of time is not ensured. Moreover, the function of semiconductor components such as semiconductor diodes is limited by the temperature rise, occurring during operation, especially since in many cases, for example in gallium arsenide components, the adverse action of the ambient atmosphere is further increased as the temperature rises.

It is known for the purpose of sealing and/or improving the electrical qualities of the circuit components, to coat the components, at least partially, with a glass composition (German Patent 1,179,277). The glass, having a low softening point, should adhere, plastically, at the surface of the circuit component which is to be coated. Due to the relatively low heat conductance of the glass, the heat occurring during the coating operation is insufficiently removed. Furthermore, molecule chains break open while the glass is softening or other networks present in the glass can be broken open so that locally ions are freed. See H. Krebs "Über den strukturellen Aufbau von Gläsern" in "Angewandte Chemie" (Applied Chemistry), VOl. 78, 1966, No. 11, pp. 577–587. These ions can, for example in the electrical field of a diode, become situated across the surface of said diode, in a way that a channel forms at said diode surface. This channel whose conductivity is opposed to the original material in turn causes the flow of an undesirably high biasing current.

It is an object of our invention to avoid these short comings and to improve the electrical properties and the lifetime of semiconductor components so that the latter will have high longevity stability.

To this end, and in accordance with the invention, a carrier for semiconductor components is comprised of a carrier portion of a material with good electrical and thermal conductivity and is provided with a thin tightly adhering electrical insulating layer, at least on the surface which faces the semiconductor component.

As previously mentioned, it was discovered that the utilization of semiconductor components is limited by the operational temperature rise which frequently produces adverse influences, stemming from the ambient atmosphere, for example in GaAs luminescence diodes. The invention is based on the recognition that these influences can be eliminated by providing at least the active part of the semiconductor component, that is the part wherein the highest heat quantity occurs during operation, such as the *p-n* junction of semiconductor diodes, with an appropriately dimensioned carrier.

The following conditions are placed on said carrier. The carrier must have a high heat conductance. It must be comprised of electricity conducting and electrically insulated regions. The expansion coefficients of the various regions must coincide as much as possible with the expansion coefficient of the semiconductor component. The individual parts must be brought into intimate contact with each other, so that the connection has sufficient mechanical stability and a good thermal contact.

We have found the use of a metal as the electricity and thermal-conducting material for the carrier member, and preferably tantalum, advantageous. Tantalum complies with all above specified conditions and is also able to getter particular components of the atmosphere, such as oxygen, and thus reliably keep them removed from the semiconductor component.

In selecting the material for the carrier member it is sometimes favorable, especially with regard to adjusting the thermal expansion coefficient to the material of the semiconductor member, that the carrier be comprised of at least two layers of materials of variable electrical and thermal conductivity, preferably of two metal layers. A suitable material for the carrier is a tantalum layer, provided with a copper layer.

The thin insulating layer which is located at least on the surface of the carrier portion that faces the semiconductor component, is preferably an oxide layer and is preferably comprised of an oxide of a metal of the carrier portion.

Other metals, such as titanium, can be used, in addition to the preferred tantalum, for the carrier member. The important fact is that the metals to be used as carrier have qualities similar to tantalum. These qualities include: a high heat conductivity, an expansion coefficient of the metal and of its oxide that is similar to the expansion coefficient of the semiconductor material, a relatively high oxidability of the metal permitting formation of adhering oxide layers, so that the connection of the metal layer with the oxide layer has a sufficient mechanical stability and a good heat contact.

It is furthermore preferred to design the carrier in form of a plate, so that the carrier can be produced according to the planar method. For this type of process, tantalum is also best suited, since a tightly adhering layer of tantalum oxide can be placed upon this metal and, thus, constitutes a very good electrical insulation layer.

According to another embodiment, the carrier provided with the electrical insulation layer is subdivided into several, mutually insulated carrier components. This embodiment is preferred, especially when more than two variably doped regions of the semiconductor member, which is to be provided with a carrier, are applied to various electrical potentials and must, therefore, be insulated, as for example in transistors.

When the semiconductor component is a resistor or a diode, for example, the electrical contacts are preferably placed upon the electric insulation layer. A further modification of the invention is that at least one electrical contact of the component is placed upon the electrical insulation layer and that at least another electrical contact is connected with the carrier portion, via the insulation layer.

Other features and details of the invention can be derived from the following specification of preferred embodiment examples with reference to the drawing in which the same parts have the same reference numerals. The FIGS. of which FIGS. 1 to 3 are in section, all relate to the invention.

Figure 1:
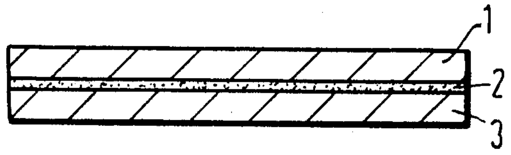
FIG. 1 shows in section a carrier for semiconductor components according to the invention.

In FIG. 1, the carrier 3 with good electrical and thermal conductance properties is provided, on the surface facing the semiconductor component 1, with a tightly adhering, electrical insulation layer 2.

Figure 2:
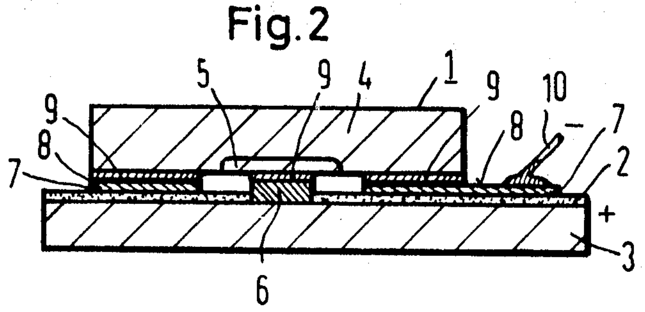
FIG. 2 shows a luminescence diode.

In FIG. 2, the luminescence diode 1, provided with the carrier according to our invention, is composed of two oppositely doped regions, for example an *n*-region 4 and a *p*-region 5, of a GaAs original crystal. The *n*-doped crystal region 4 is shown in disc form in the figure. It proved preferable to provide said crystal region 4 with a special geometrical form which became known, in another connection, under the name "Weierstrasse-geometry." This is done in order to reduce the reflection losses in the luminescence light which is generated in the diode and is emitted through said region 4. Region 4 is comprised of a cylindrical portion, adjoined by a hemispherical portion. The height of the cylindrical part is equal to the quotient from the radius of the hemispherical part and to the indices of refraction of the semiconductor material being employed. This geometry permits the beam generated in the semiconductor crystal to be emitted from said crystal nearly parallel and perpendicularly upward whereby only slight stray losses occur. The planar, large area carrier portion 3 comprises a metal, more particularly tantalum. On the side facing the luminescence diode 1, the carrier 3 is provided with a nickel contact piece 6 which leads to region 5 of diode 1 and with an oxide layer 2 of the employed metal, particularly a tantalum oxide layer, which encloses said contact piece 6. This layer 2 is provided with a chromium/nickel layer 7, which surrounds the nickel contact 6, with clearance, and whose surface facing diode 1, is preferably gold-plated as seen at 8. The nickel contact 6 is tightly connected via a thin tin layer 9 with region 5 of the diode 1, while the gold-plated chromium/nickel layer 7 is tightly connected with region 4 of diode 1, via a thin tin layer 9.

It is expedient to solder the nickel contact 6 upon the carrier part 3. The nickel contact 6 can also be applied, for example, by spot welding, by electrolytic precipitation or by vapor depositing the nickel on the carrier part 3. To this end, the tantalum surface which should not be coated is covered in a known manner with a photo varnish layer, during the spot welding process, and with a suitable masking during the pyrolytic precipitation or vapor deposition. The tantalum oxide layer 2 which encloses the contact piece 6 is preferably formed by thermal oxidation and the nickel oxide which occurs thereby on the nickel contact surface, is reduced in a hydrogen atmosphere. It can also be advantageous to apply the tantalum oxide layer, by electrolysis, upon the carrier 3 which preferably comprises tantalum. In this method, the metal contact piece 6, preferably comprised of nickel, is vapor deposited upon the tantalum carrier after the deposition of the tantalum oxide layer 3 at the intended places which are exposed through etching.

The chromium/nickel layer 7 which encloses the nickel contact piece 6, is preferably vapor deposited, in vacuum, upon the tantalum oxide layer at such thickness, and subsequently gold-plated, so that the nickel contact surface and the surface of the gold-plated, chromium/nickel layer are situated in one plane. If, for example, the nickel contact rises 15 microns above the surface of the tantalum carrier 3, the total thickness of the layers 2, 7 and 8 must preferably also amount to 15 micron, with the tantalum oxide layer 2 contributing the biggest share of the entire thickness while the gold film 8 is no thicker than about 0.1 to 1 micron.

Subsequently, the two mutually insulated contact surfaces, which are preferably located in one plane, are firmly soldered with the two tin-plated diode contact surfaces 9, positioned in one plane, and the contact surface 8 is provided with a current lead 10. The other current supply can be provided directly by the tantalum carrier 3 and the metal contact piece 6, comprised of nickel.

Figure 3:
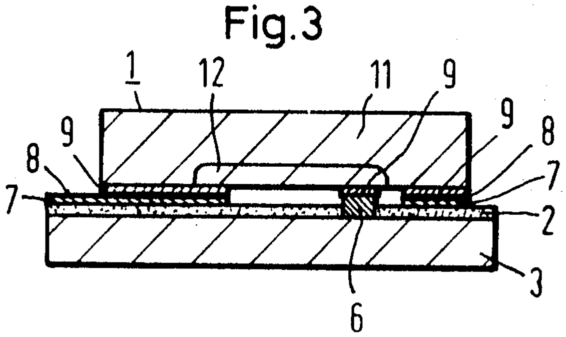
FIG. 3 shows a Gunn oscillator.

FIG. 3 shows a Gunn oscillator provided with a carrier according to the invention. The Gunn oscillator 1 is composed of a semiinsulated region 11 and an $n$-doped region 12, preferably of a GaAs crystal. On the side facing semiconductor body 1, the carrier 3, preferably consisting of tantalum, is provided with a metal contact piece 6 which preferably leads to region 12 of the diode and which is preferably a nickel contact piece, and with an oxide layer 3 of the employed metal, preferably a tantalum oxide layer, surrounding contact piece 6. This layer 3 is coated with layer 7 which surrounds the nickel contact 6, with clearance, and which is preferably comprised of chromium nickel. The surface of layer 7 which faces the diode 1 is preferably gold-plated. The thin gold layer is indicated with reference numeral 8. The nickel contact 6 is in close contact, via a thin tin layer 9, with region 12 of the diode and the gold-plated chromium/nickel layer 7 is in tight contact with region 11 of diode 1, via a thin tin layer 9.

Figure 4:
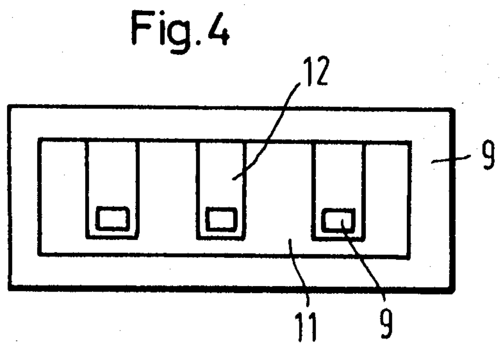
FIG. 4 shows a plan view of an integrated circuit with three Gunn oscillators.

FIG. 4 shows, in top view, an integrated circuit with three Gunn oscillators as illustrated in FIG. 3. The integrated circuit is provided with a carrier according to the invention. This figure shows only $n$-region 12, the semiinsulated region 11 of the GaAs crystal, and the tin-plated diode contact surfaces 9, which are preferably positioned in the same plane. The two mutually insulated contact surfaces which lie in the same plane and which are situated upon the planar carrier, were omitted in the interest of better clarity.

The carrier of the present invention, used for semiconductor components, is also suitable for improving the electrical properties and the lifespan of other semiconductor components, not specifically mentioned in this application, for example such as transistors and avalanche diodes.

We claim:

1. A luminescende diode with a carrier which comprises an electricity and heat conducting material main carrier member and a thin and adhesive electrical insulation layer which is located at least on that surface of the main carrier member that faces said semiconductor component, wherein said carrier member being comprised of tantalum, and said electrical insulation layer of tantalum oxide, and one electrical contact piece of nickel is connected through the insulating layer with the carrier member and leads to one region of the diode, while another gold-plated chromium/nickel layer, which constitutes a second electrical contact, is situated upon the insulating layer surrounding the contact piece and is tightly connected with the other region of said diode.

2. The luminescence diode of claim 1, wherein the contact piece and chromium/nickel layer are connected to the diode by means of a thin tin layer.

3. The method of producing a luminescence diode, which comprises soldering a contact piece of nickel onto a planar carrier member of tantalum, thermally oxidizing a layer of tantalum oxide on the contact piece, reducing the nickel oxide which results on the surface of the contact piece in a hydrogen atmosphere, vapor depositing in a vacuum a chromium/nickel layer which surrounds said contact piece upon the tantalum oxide layer, gold plating of the nickel contact piece and the surface of the chromium/nickel layer, so that both the gold-plated surface of the chromium/nickel layer and the top surface of the contact piece lie in one plane, whereby the metal contact piece leading to one diode region and the metal layer which surrounds with clearance said metal contact piece and which is to contact the other diode region, are firmly soldered with the two tin-plated contact surfaces of the diode that are situated in the same plane.